United States Patent [19]

Kim

[11] Patent Number: 5,350,702
[45] Date of Patent: Sep. 27, 1994

[54] METHOD FOR FABRICATING A DUAL-GATE METAL-SEMICONDUCTOR FIELD EFFECT TRANSISTOR

[75] Inventor: Seok T. Kim, Suwon, Rep. of Korea

[73] Assignee: Samsung Electronics Co., Ltd., Kyungki-do, Rep. of Korea

[21] Appl. No.: 38,940

[22] Filed: Mar. 29, 1993

[30] Foreign Application Priority Data

Mar. 28, 1992 [KR] Rep. of Korea .......... 92-5179

[51] Int. Cl.$^5$ .......... H01L 21/265
[52] U.S. Cl. .......... 437/40; 437/56; 437/65; 437/176; 437/912; 148/DIG. 73
[58] Field of Search .......... 437/40, 41, 56, 912, 437/911, 64, 65, 66, 176, 177, 133, 126, 927; 148/DIG. 73, DIG. 111

[56] References Cited

U.S. PATENT DOCUMENTS

| | | |
|---|---|---|
| 3,823,352 | 7/1974 | Pruniaux et al. |
| 4,499,481 | 2/1985 | Greene. |
| 4,601,096 | 7/1986 | Calviello .......... 437/176 |
| 4,639,275 | 1/1987 | Holoyak, Jr. .......... 437/126 |
| 4,791,072 | 12/1988 | Kiehl .......... 437/56 |
| 4,883,770 | 11/1989 | Dohler et al. .......... 437/107 |
| 5,164,218 | 11/1992 | Tsuruta et al. .......... 437/65 |

FOREIGN PATENT DOCUMENTS

| | | | |
|---|---|---|---|
| 59-110186 | 6/1984 | Japan .......... | 437/107 |
| 60-39872 | 3/1985 | Japan .......... | 437/176 |

Primary Examiner—Tom Thomas
Assistant Examiner—Michael Trinh
Attorney, Agent, or Firm—Cushman, Darby & Cushman

[57] ABSTRACT

A dual gate metal semiconductor field effect transistor is disclosed which comprises a semi-insulating compound semiconductor substrate, a first and a second insulating layer in stripe pattern in different width formed on said semiconductor substrate at a predetermined angle against the $<\overline{1}10>$ direction, a first semiconductor layer having a first and a second voids on said first and second insulating layers in stripe pattern, a second semiconductor layer subsequently formed to said first semiconductor layer, source and drain regions having impurities partially diffused to said first and second semiconductor layers, a first and a second gate electrodes formed in different width on said second semiconductor layer positioned corresponding to said first and second insulating layers in stripe pattern, source and drain electrodes formed on said source and drain regions. With such a construction, by forming the void at the lower part of the conductive layer by using the selective MOCVD according to the crystal orientation of the substrate, the conductive thickness can be adjusted, so that recess etching is not required therefor. In addition, leakage current can be prevented without forming the buffer layer of high purity requiring a high resistance as in the conventional technique for the semiconductor substrate and conductive layer, and properties of low noise and high gain is obtained.

8 Claims, 2 Drawing Sheets

METHOD FOR FABRICATING A DUAL-GATE METAL-SEMICONDUCTOR FIELD EFFECT TRANSISTOR

BACKGROUND OF THE INVENTION

The present invention relates to a dual gate metal-semiconductor field effect transistor and a fabricating method thereof, and more particularly, to a dual gate metal-semiconductor field effect transistor which has properties of high gain and low noise by forming conductive layers with different thickness to each other at the lower part of the gate electrode by using a void structure formed by selective epitaxy on a semi-insulating GaAs substrate.

Recently, according to the rapid progress toward an information telecommunication which requires a rapidity and an accuracy, the need for ultrahigh speed computers, ultrahigh frequency communication and optical communication is more and more increasing. However, the conventional semiconductor devices based on Si have limits in satisfying these needs due to its material properties of the silicon semiconductor. Therefore, a research and development of a compound semiconductor devices using a compound semiconductor such as GaAs, Gap, Imp having a superior properties to the silicon semiconductor is being actively persued. The above compound semiconductors have superior electrical properties, such as high electron mobility and semi-insulation, so that they are advantageous for military applications and space communications owing to its lower power consumption and faster operation speed than Si. Those devices include the junction field effect transistor, the metal semiconductor field effect transistor, the heterojunction bipolar transistor and high electron mobility transistor.

The technique with relative importance is the field of MESFET in which a plurality of carriers are transferred between the metal semiconductor contacts.

Generally, the MESFET controls the current flowing through a channel formed between a source and a drain regions by varying the effective channel thickness dependent on the width of a depletion layer formed on the lower region of the gate electrode by applying a voltage to the gate electrode in Schottky contact with the region between the source and drain regions.

FIG. 1 is a cross-sectional view of the conventional dual gate MESFET.

The conventional dual gate MESFET comprises an undoped GaAs buffer layer 12 grown on the upper part of a semi-insulating GaAs substrate 10, an N-type GaAs conductive layer 13 grown on the upper part of the buffer layer 12, N-type source and drain regions 14 and 15 partially diffused to the buffer layer 12 and the conductive 13, source and drain electrodes 17 and 19 being in ohmic contacts with the source and drain regions 14 and 15, a first gate electrode 16 being in Schottky contacts with the surface of the partially recess-etched conductive layer 13 between the source and drain regions 14 and 15, and a second gate electrode 18 having a little wider width than the first gate electrode 16 and adjacent to the first gate electrode 16 on the region of the conductive layer 13 except the region which does not have recess-etching.

In such a conventional dual gate MESFET, the gain can be controlled by varying the voltage of the first gate electrode 16 or the second gate electrode 18. That is, by supplying a sufficient current to the first gate electrode 16 of MESFET of the front stage and operating the MESFET of the back stage at the maximal drain current, much electrical gain can be obtained.

The MESFET is variously applied to such a circuit processing an ultrahigh frequency signal as in mixer and automatic gain controller.

In the dual gate MESFET, the thickness h1 and h2 of the lower conductive layer 13 of the first gate electrode 16 and the second gate electrode 18 is controlled by recess-etching. The MESFET having the conducive layer 13 with different thickness by recess-etching is more stably operated in the wide band frequency region than the MESFET having the conductive layer with the same thickness of the lower part of the gate electrode. However, in this respect, a problem exists in that the process of partially recess-etching the conductive layer 13 of the lower part of the first gate electrode 16 by using a dry or wet-etching method renders the fabricating processes more complicated, such as leaving the etching remnant. Moreover, since a step difference is formed on the surface of the conductive layer 13 due to the etched region, which badly affects the following process of photolithograpy. Besides, for the purpose of preventing leakage current of the semiconductor substrate 10, the buffer layer 12 with high resistance and a good crystal condition is to be grown.

SUMMARY OF THE INVENTION

It is an object of the present invention to provide a dual gate metal semiconductor field effect transistor and a fabricating method thereof having a low noise and a high gain by differentiating the thickness of the conductive layers at the lower part of the gate electrode by a selective epitaxial method which forms a void at the lower part of conductive layer.

Another object of the present invention is to provide a dual gate MESFET and the fabricating method thereof which prevents occurrence of leakage current by separating the conductive layer and substrate region by using the void, independent on formation of the buffer layer requiring a high resistance.

According to the present invention, there is provided a dual gate metal semiconductor field effect transistor comprising : a semi-insulating compound semiconductor substrate; a first and a second insulating layer in stripe pattern in different width formed on said semiconductor substrate at a predetermined angle against the $<\bar{1}10>$ direction; a first semiconductor layer having a first and a second voids on said first and second insulating layers in stripe pattern; a second semiconductor layer subsequently formed to said first semiconductor layer; source and drain regions having impurities partially diffused to said first and second semiconductor layers; a first and a second gate electrodes formed in different width on said second semiconductor layer positioned corresponding to said first and second insulating layers in stripe pattern; source and drain electrodes formed on said source and drain regions.

There is also providing a method for fabricating the dual gate metal semiconductor field effect transistor comprising: forming a first and a second insulating layers in stripe pattern on a semi-insulating compound semiconductor substrate in different width at a predetermined angle against the $<\bar{1}10>$ direction; selectively growing a first semiconductor layer on said semiconductor substrate by using said first and second insulating layers in stripe pattern as a mask; forming a first and a second voids in different height on the upper part of said first and second insulating layers in stripe pattern by selectively growing said second semiconductor layer subsequent to the selective growth of said first semiconductor layer; forming source and drain regions by partially ion-implanting a predetermined conductive impurities to said first semiconductor layer; forming a first and a second gate electrodes in different width on said second semiconductor layers positioned corresponding to said first and second insulating layer in stripe pattern.

With such a construction, by forming the void at the lower part of the conductive layer by using the selective MOCVD according to the crystal orientation of the substrate, the conductive thickness can be adjusted, so that recess etching is not required therefor. In addition, leakage current can be prevented without forming the buffer layer of high purity requiring a high resistance as in the conventional technique for the semiconductor substrate and conductive layer, and properties of low noise and high gain is obtained.

BRIEF DESCRIPTION OF THE DRAWINGS

These and other objects, features, and advantages of the present invention will become more apparent from the following description of the preferred embodiment taken in conjunction with the accompanying drawings, in which.

DETAILED DESCRIPTION OF THE PREFERRED EMBODIMENT

Now, the preferred embodiment according to the present invention will be explained in detail with the accompanying drawings.

Figure 1:
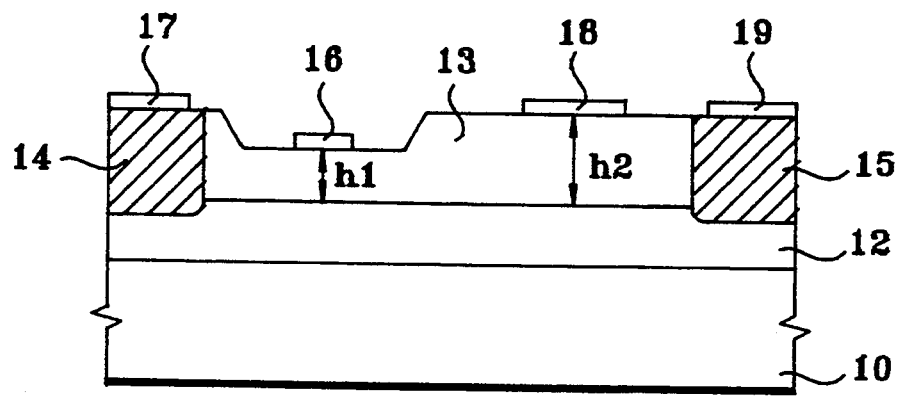
FIG. 1 is a cross-sectional view of a dual gate metal semiconductor field effect transistor according to the present invention.
Figure 2:
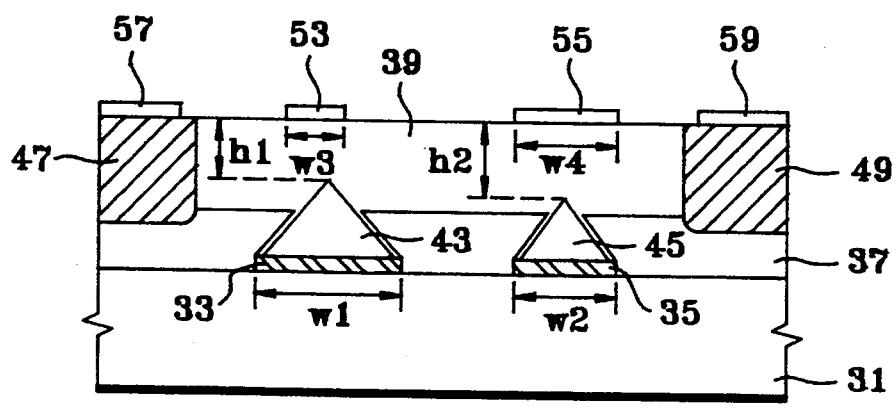
FIG. 2 is a cross-sectional view of one embodiment of the dual gate metal semiconductor field effect transistor according to the present invention.

FIG. 2 is a cross-sectional view of one embodiment of the dual gate MESFET according to the present invention.

Referring to FIG. 2, a first and a second insulating layers in stripe pattern 33 and 35 are formed in different widths w1 and w2 on the surface of a semi-insulating GaAs substrate 31. The first and the second insulating layers 33 and 35 in stripe pattern are formed from a material selected from the group consisting of $SiO_2$ and $Si_3N_4$. On the first and the second insulating layers 33 and 35 in stripe patterns, highly doped N+-type GaAs conductive layer 37 and N-type GaAs conductive layer 39 having triangular voids 43 and 45 are subsequently formed for ohmic contact.

N-type impurities such as Si are highly ion-implanted, so that source and drain regions 47 and 49 are formed partially diffused to the N+-type GaAs layer 37 and the conductive layer 39. A first and a second gate electrodes 53 and 55 in different widths w3 and w4 are formed on the conductive layer 39 of the upper part of the voids 43 and 45, respectively.

In the dual gate MESFET of the present invention, the thicknesses h1 and h2 of the conductive layer 39 formed at the lower part of the gate electrodes 53 and 55 can be formed in different height to each other owing to the voids 43 and 45 formed below the conductive layer 39. Therefore, the step difference will never occur in the conductive layers due to recess etching.

In addition, the voids 43 and 45 at the lower part of the conductive layer 39 form a potential barrier against the electron, so that the semiconductor substrate 31 is electrically separated from the conductive layer 39. Therefore, leakage current can be prevented even without forming a conventional buffer layer of high purity requiring high resistance.

Figure 3A:
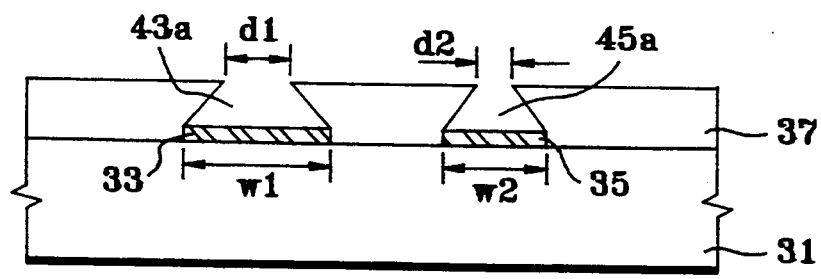
FIGS. 3A to 3C are diagram of fabricating processes of the dual gate metal semiconductor field effect transistor of FIG. 2.
Figure 3B:
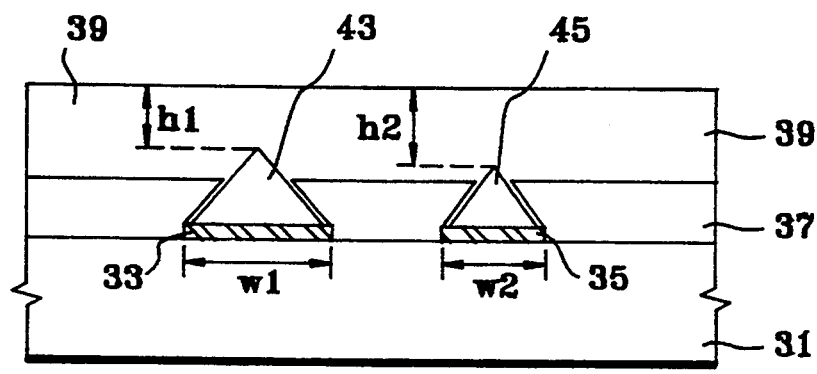
Figure 3C:
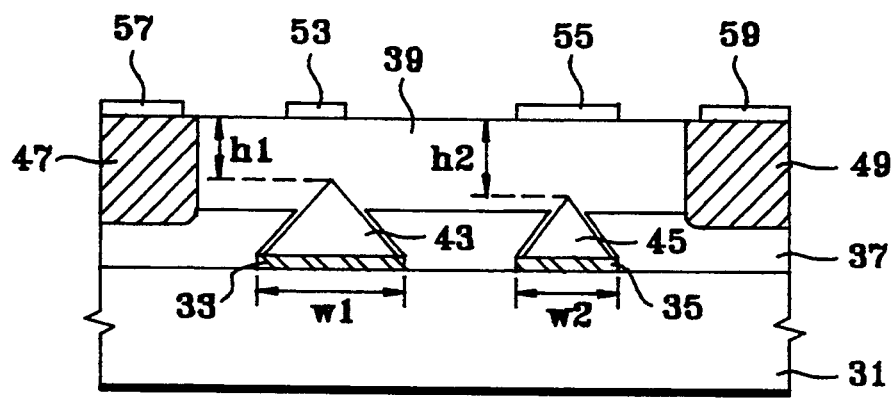

FIGS. 3A to 3C are diagram of fabricating processes of dual gate MESFET of FIG. 2 according to the present invention.

Referring to FIG. 3A, an insulating layer such as $SiO_2$ or $Si_3N_4$ is deposited on the surface of semi-insulating GaAs substrate 31 having (001) crystal plane in thickness of $500 \sim 1,000 Å$. Thereafter, a first and a second insulating layers 33 and 35 in stripe pattern are formed in different width by a conventional photoetching. At this time, the first and the second insulating layers 33 and 35 in stripe pattern are angled $20° \sim 30°$ from the $<\overline{1}10>$ direction of the GaAs substrate 31. The width w1 of the stripe pattern of the first insulating layer 33 is wider than the width w2 of the second insulating layer 35.

Thereafter, N+-type GaAs layer 37 with high concentration is grown by Selective Metal Organic Chemical Vapor Deposition(hereinafter referred to as SMOCVD). At this time, because of the characteristic of crystal growth by SMOCVD according to the crystal orientation of a semiconductor substrate 31, the N+-type GaAs layer 37 is selectively grown only on the surface of the GaAs substrate 31 other than on the surface of the first and the second insulating layers 33 and 35 in stripe pattern, thereby forming voids 43a and 45a having sidewall of inverse slant at the upper part of the first and the second insulating layers 33 and 35 in stripe pattern.

The distance between the zeniths d1 and d2 of the voids 43a and 45a formed on the N+-type GaAs layer 37 by the SMOCVD method is dependent on the widths w1 and w2 of the stripe pattern of the first and the second insulating layers. That is, the zenithal distance d1 of the void 43a is longer than the zenithal distance d2 of the void 45a.

Referring to FIG. 3B, low doped N-type GaAs layer conductive layer 39 is subsequently selectively formed by the same SMOCVD method on the N+-type GaAs layer 37. At this time, the conductive layer 39 is simultaneously grown on the N+-type GaAs layer 37 and on the inverse slant and then are incorporated, by which empty voids 43 and 45 are formed with its upper part flattened. Therefore, the height h1 from the surface of the conductive layer 39 to the zenith of the void 43 is formed lower than the height h2 from the surface of the conductive 39 to the zenith of the void 45. That is, the thickness of the conductive layer 39 can be automatically adjusted.

Referring to FIG. 3C, a nitride layer(not shown)is deposited on N-type GaAs conductive layer 39 and nitride layer mask pattern is formed in order to form source and drain regions 47 and 49 by the conventional photo-etching. Thereafter, N-type impurities such as Si are heated after ion-implanting by the conventional ion-implanting method and then partially diffused to N+-type GaAs layer 37 in order to form source and drain regions 47 and 49. And then, source and drain electrodes 57 and 59 and a first and a second gate electrodes 53 and 55 are formed by the conventional left-off process. At this time, the source and drain electrodes 57 and 59 form an ohmic contact with the source and drain regions 47 and 49, while the first and the second gate electrode 53 and 55 form a Schottky contact with the conductive layer 39 positioned corresponding to the voids 43 and 45. The width w3 of the first gate electrode 53 is formed narrower than the width w4 of the second gate electrode 55. The source and drain electrodes 57 and 59 consist of AuGe/Ni/Au, while the first and the second gate electrodes 53 and 55 consist of Ti/Pt/Au or $WSi_2$.

Figure 4:
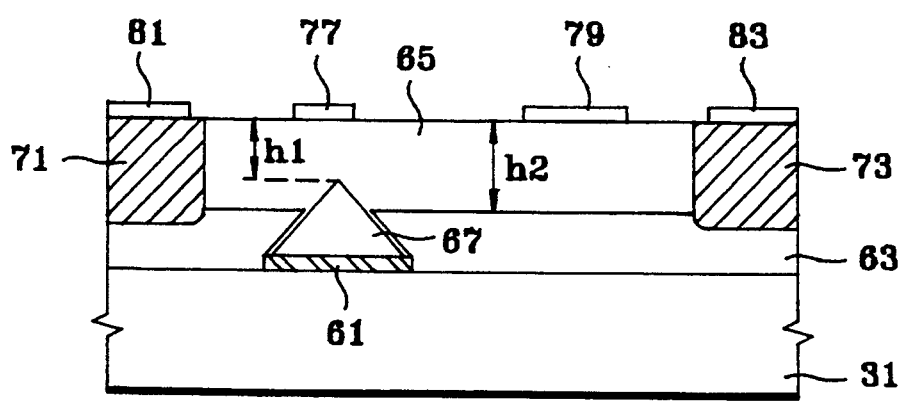
FIG. 4 is a cross-sectional view of another embodiment of the dual gate metal semiconductor field effect transistor according to the present invention.

FIG. 4 is a cross-sectional view of another embodiment of the dual gate MESFET according to the present invention.

As shown in FIG. 4, in order to differentiate the thickness h1 and h2 of the conductive layer 65 at the lower part of the first and the second gate electrodes 77 and 79, a void 67 exists at the lower part of the first gate electrode 77, different from the first embodiment.

The void 67 formed at the lower part of the first gate electrode 77 is formed in such a manner that undoped GaAs layer 63 and N-type GaAs conductive layer 65 are crystally grown by SMOCVD method by using an insulating layer 61 in stripe pattern, which is angled $20° \sim 30°$ against the $<\overline{1}10>$ direction of the GaAs substrate 31.

The dual gate MESFET having a single void 67 according to the second embodiment basically has the same structure to the MESFET according to the first embodiment, except the number of the void. Particularly, it is noted that the processes of the second embodiment are simple, compared to the first embodiment, because the single insulating layer stripe pattern 61 is formed.

As mentioned up to now, the dual gate MESFET according to the present invention has advantageous in that the thickness of the conductive layer which is requisite for the dual gate structure can be adjusted without recess etching. Therefore, there is no room for occurrence of step difference of the conductive layer due to the recess etching, thereby reducing inferiority of processes. In addition, because the void at the lower part of the conductive layer forms the potential barrier, the substrate is electrically separated from the conductive layer, resulting in the effect that leakage current can be prevented without forming the buffer layer requiring a conventional high resistance.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What is claimed is:

1. A method for fabricating a dual gate metal semiconductor field effect transistor comprising the steps of:
    forming a first and a second insulating layers in stripe pattern on a semi-onsulating compound semiconductor substrate in different width titled against a $<\overline{1}10>$ direction;
    selectively growing a first semiconductor layer on said semiconductor substrate by using said first and second insulating layers in stripe pattern as a mask;
    forming a first and a second voids in different height on an upper part of said first and second insulating layers in stripe pattern by selectively growing a second semiconductor layer subsequent to the selective growth of said first semiconductor layer;
    forming source and drain regions by partially ion-implanting conductivity impurities to said first semiconductor layer; and
    forming a first and second gate electrodes in different width on said second semiconductor layer positioned corresponding to said first and second insulating layers in stripe pattern.

2. The method according to claim 1, wherein said semi-insulating semiconductor substrate is made of a material selected from the group consisting of GaAs, InP, and GaP.

3. The method according to claim 1, wherein said first and second insulating layers in stripe pattern is angled $20° \sim 30°$ against the $<\overline{1}10>$ direction.

4. The method according to claim 1 or 3, wherein said first and second insulating layers in stripe pattern are formed from a material selected from the group consisting of $SiO_2$ and $Si_3N_4$.

5. The method according to claim 1, 3 or 4, wherein the width of the stripe pattern of said first insulating layer is wider than that of the second insulating layer.

6. The method according to claim 1, wherein said first and second semiconductor layers are crystally grown by selective MOCVD.

7. The method according to claim 1, said first gate electrode is formed wider than said second gate electrode.

8. The method according to claim 1, wherein said first semiconductor layer is more highly doped than said second semiconductor layer.

* * * * *